(12) United States Patent
Schulze et al.

(10) Patent No.: US 7,884,389 B2
(45) Date of Patent: Feb. 8, 2011

(54) BIPOLAR POWER SEMICONDUCTOR COMPONENT COMPRISING A P-TYPE EMITTER AND MORE HIGHLY DOPED ZONES IN THE P-TYPE EMITTER, AND PRODUCTION METHOD

(75) Inventors: Hans-Joachim Schulze, Ottobrunn (DE); Franz-Josef Niedernostheide, Muenster (DE); Uwe Kellner-Werdehausen, Leutenbach (DE); Reiner Barthelmess, Soest (DE)

(73) Assignee: Infineon Technologies AG, Munich (DE)

( * ) Notice: Subject to any disclaimer, the term of this patent is extended or adjusted under 35 U.S.C. 154(b) by 668 days.

(21) Appl. No.: 11/651,937

(22) Filed: Jan. 10, 2007

(65) Prior Publication Data

US 2007/0215981 A1    Sep. 20, 2007

(30) Foreign Application Priority Data

Jan. 10, 2006   (DE)   ................ 10 2006 001 252

(51) Int. Cl.
   *H01L 29/74*   (2006.01)
(52) U.S. Cl. ................ 257/115; 257/152; 257/157; 257/E29.197
(58) Field of Classification Search .............. 257/107, 257/197, 565, 115, 152, 157, E29.197
   See application file for complete search history.

(56) References Cited

U.S. PATENT DOCUMENTS

| 4,617,583 A | 10/1986 | Shinohe et al. |
| 4,782,379 A | 11/1988 | Baliga |
| 5,331,184 A | 7/1994 | Kuwahara |

FOREIGN PATENT DOCUMENTS

| DE | 102004005084 A1 | 8/2005 |
| DE | 102005023479 A1 | 11/2006 |
| EP | 0316881 | 11/1988 |
| JP | 63094679 A | 4/1988 |

*Primary Examiner*—Jack Chen
(74) *Attorney, Agent, or Firm*—Maginot, Moore & Beck

(57) ABSTRACT

Bipolar power semiconductor component comprising a p-type emitter and more highly doped zones in the p-type emitter, and production method. The invention relates to a bipolar power semiconductor component comprising a semiconductor body (1), in which a p-doped emitter (8), an n-doped base (7), a p-doped base (6) and an n-doped main emitter (5) are arranged successively in a vertical direction (v). The p-doped emitter (8) has a number of heavily p-doped zones (82) having a locally increased p-type doping.

15 Claims, 5 Drawing Sheets

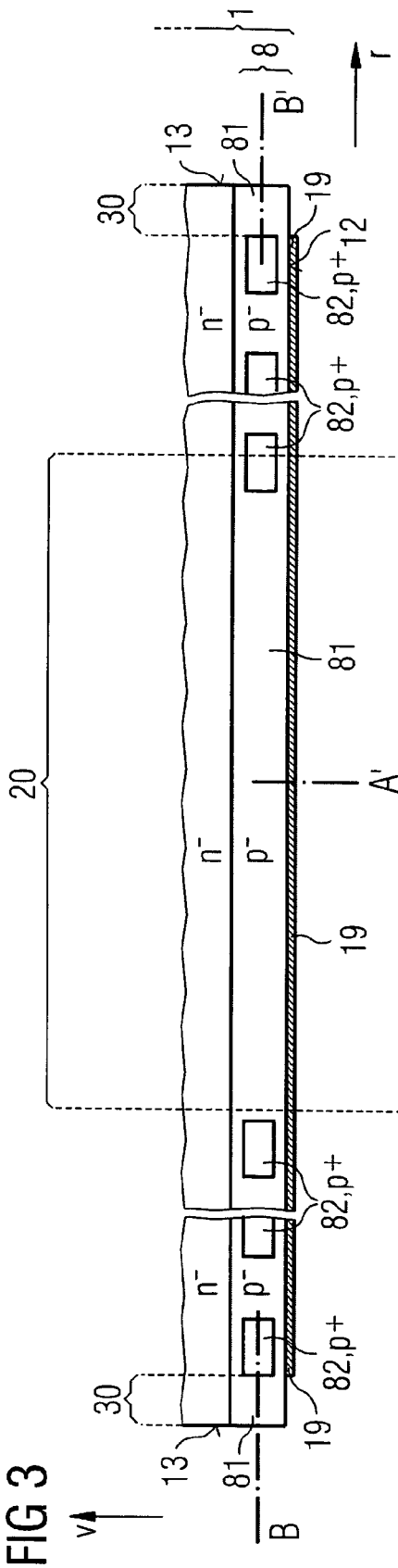
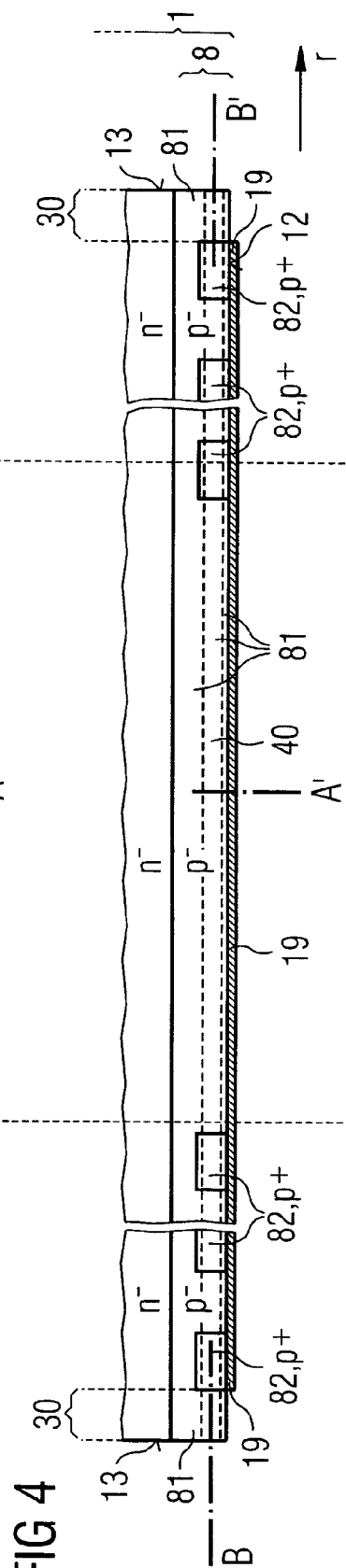
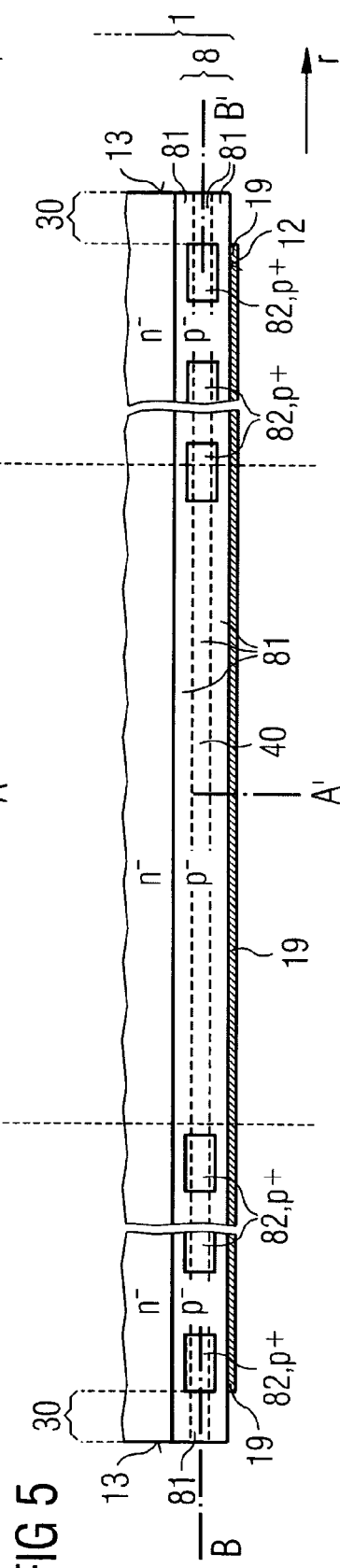

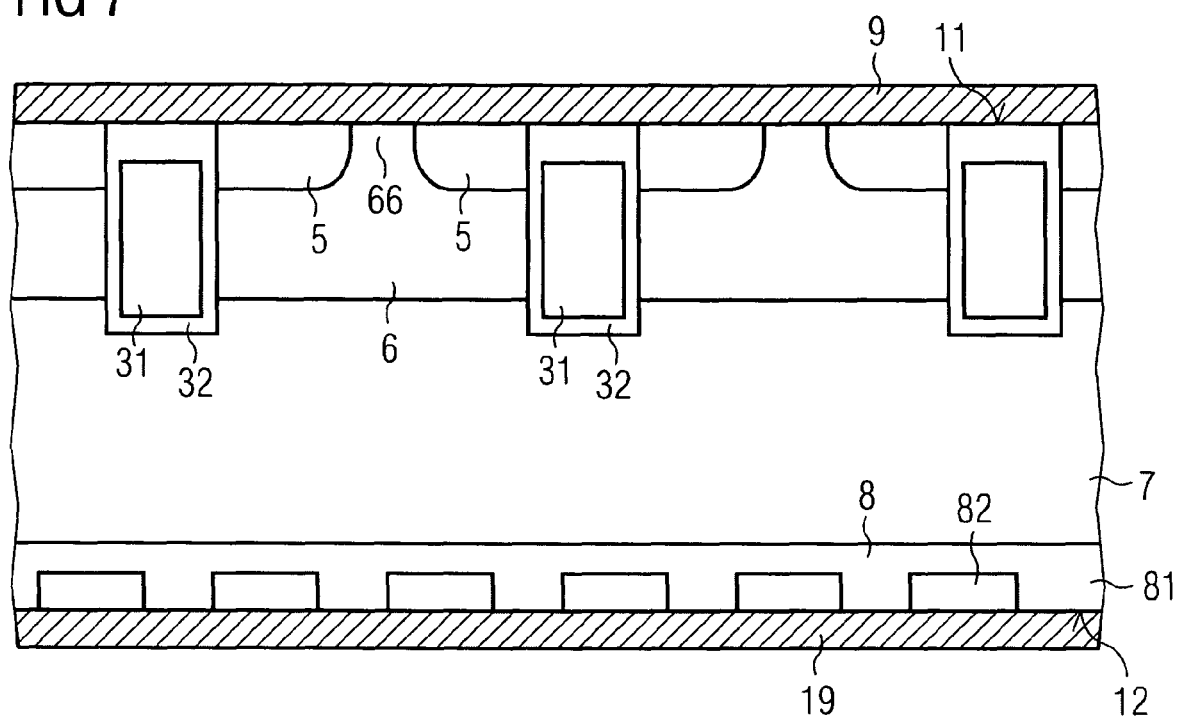

BIPOLAR POWER SEMICONDUCTOR COMPONENT COMPRISING A P-TYPE EMITTER AND MORE HIGHLY DOPED ZONES IN THE P-TYPE EMITTER, AND PRODUCTION METHOD

TECHNICAL BACKGROUND

The present invention relates to a bipolar power semiconductor component, in particular a power thyristor or a power IGBT.

In the case of bipolar power semiconductor components, it is generally necessary to find a suitable compromise for the forward voltage, the surge current strength or the short-circuit strength and the stored charge, since these properties partly compete with one another.

In order to achieve a highest possible maximum permissible surge current, nowadays bipolar power semiconductor components are produced with the largest possible area. Technological and economic limits are placed on this measure, however, owing to the availability and price of the semiconductor material used.

An ideal ratio of forward voltage and stored charge can be achieved, in principle, by means of a smallest possible thickness of the component. However, this is limited by a minimum required blocking capability of the component.

SUMMARY

One exemplary embodiment of a bipolar power semiconductor component according to the invention has a semiconductor body, in which a p-doped emitter, an n-doped base, a p-doped base and at least one n-doped emitter are arranged successively in a vertical direction. In the case of a power IGBT, these component zones in the order mentioned are also referred to as p-type emitter, drift zone, body zone and source zone.

Arranged in the p-doped emitter, which has a weaker p-type doping than comparable conventional bipolar power semiconductor components, are heavily p-doped zones having a locally increased p-type doping, that is to say having a higher p-type doping in comparison with the remaining regions of the p-type emitter.

In the case of a thyristor, which may have one or more auxiliary emitters besides a main emitter, said heavily p-doped zones may be arranged in the region of the n-doped main emitter in a lateral direction. Particularly in current surge operation of the component, the heavily p-doped zones inject a multiplicity of charge carriers into the adjoining regions of the semiconductor body.

By comparison therewith, shortly after the end of the surge current case, the heavily p-doped zones no longer contribute significantly to the injection of free charge carriers.

The heavily p-doped zones therefore have the effect that in the case of a forward voltage predefined for the surge current case, the stored charge that occurs during the turn-off operation of the component is significantly reduced. This ensures that the bipolar component is turned off rapidly, since only few charge carriers have to be depleted.

The heavily p-doped zones may be spaced apart from the n-doped base and may optionally extend as far as the surface of the semiconductor body which is adjoined by the p-type emitter.

In a further embodiment of the invention, the heavily p-doped zones are arranged in insular fashion in the p-doped emitter and are surrounded in a lateral direction or else completely by a zone having a weaker p-type doping.

In order to have the effect that the space charge zone, in the case of a component blocking in the reverse direction, can propagate as far as possible into the p-doped emitter in the region of the lateral edge of the semiconductor body, it is possible to dispense with the heavily p-doped zones in the region of the lateral edge. With the aim of maximizing the forward blocking capability, moreover, the transistor gain factor of a parasitic pnp transistor present on the anode side can be set to be as low as possible by means of known measures, such as a setting of the charge carrier lifetime.

BRIEF DESCRIPTION OF THE FIGURES

Exemplary embodiments of the invention are explained in more detail below with reference to figures, in which:

FIG. 3 shows a cross section through the n-doped base and a section of the p-doped emitter of a thyristor, the p-doped emitter of which has zones having a locally increased p-type doping which are spaced apart both from the rear side of the thyristor and from the n-doped base, FIG. 4 shows a cross section through the n-doped base and a section of the p-doped emitter of the thyristor in accordance with FIG. 2, in the p-doped emitter of which is arranged a zone having a reduced charge carrier lifetime, and FIG. 5 shows a cross section through the thyristor in accordance with FIG. 3, in the p-doped emitter of which is arranged a zone having a reduced charge carrier lifetime.

FIG. 7 shows a cross section through a section of a bipolar power semiconductor component formed as an IGBT.

DETAILED DESCRIPTION OF THE FIGURES

In the figures, unless specified otherwise, identical reference symbols designate identical elements with the same function.

Figure 1:
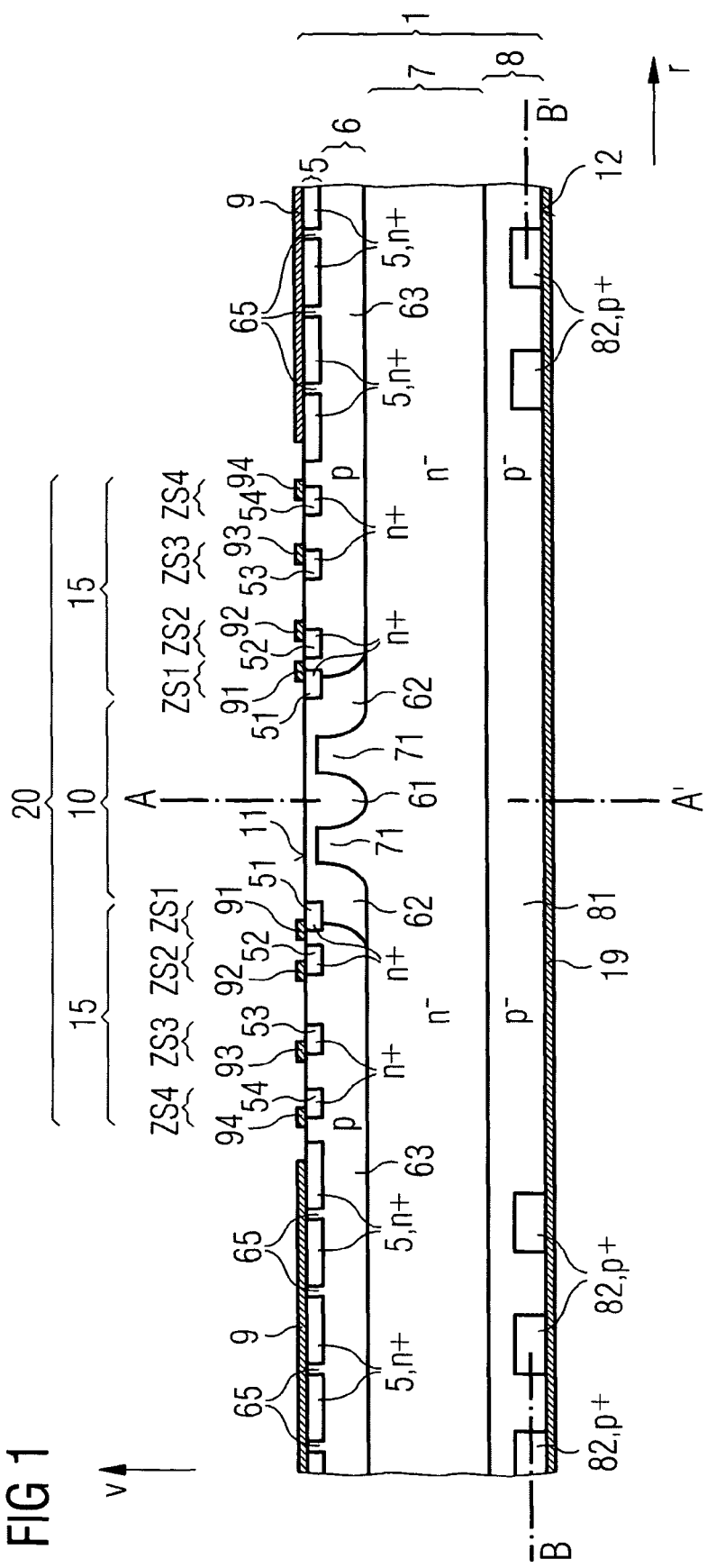
FIG. 1 shows a cross section through a section with the central region of a bipolar power semiconductor component formed as a thyristor, in the p-doped emitter of which are arranged zones having a locally increased p-type doping.

FIG. 1 shows a cross section through a section of a bipolar power semiconductor component formed as a thyristor.

The thyristor comprises a semiconductor body 1 composed of a semiconductor material such as e.g. silicon, having a front side 11 and a rear side 12 opposite the latter. A p-doped emitter 8, an n-doped base 7, a p-doped base 6 and an n-doped main emitter 5 are arranged successively in the semiconductor body 1 between the rear side 12 and the front side 11.

A cathode electrode 9 is arranged on the front side 11, and makes contact with the n-doped emitter 5. The rear side 12 correspondingly has an anode electrode 19, which makes contact with the p-doped emitter 8. The cathode electrode 9 and/or the anode electrode 19 are preferably formed from metal, for example aluminum, or from polysilicon.

The p-doped base 6 has a first section 61, a second section 62 and a third section 63, in which the p-type doping can be chosen differently.

Between the first section 61 and the second section 62, a section 71 of the n-doped base 7 extends further in the direction of the front side 11 than in the other regions of the semiconductor body 1 and forms with the first section 61 a breakdown diode 10 having curved pn junctions, the breakdown voltage of which can be set by the distance from the second section 62. Such a breakdown diode is also referred to as a BOD diode (BOD=break over diode). On account of the curvature of said pn junctions, in the case of a reverse voltage present at the thyristor, an excessive increase in the field strength occurs in the curvature region, so that the thyristor triggers at the location of the breakdown diode 10. Consequently, the breakdown voltage of the thyristor is determined by the construction of the breakdown diode 10.

The thyristor can be triggered by radiating in light, in particular infrared light, in the region of the breakdown structure 10 onto the front side 11 of the semiconductor body 1.

A triggering stage structure 15 is arranged between the breakdown diode 10 and the n-doped main emitter 5 in the lateral direction r, said structure together with the breakdown diode 10 forming a triggering region 20 of the thyristor.

The triggering stage structure comprises four triggering stages ZS1, ZS2, ZS3 and ZS4, by way of example. Each of the triggering stages ZS1-ZS4 has a heavily n-doped triggering stage emitter 51, 52, 53 and 54, respectively, which extends into the semiconductor body 1 proceeding from the front side 11.

Contact is made with each of the triggering stage emitters 51, 52, 53, 54 by an electrode 91, 92, 93 and 94, respectively, which is arranged on the front side 11 of the semiconductor body 1 and which projects over the relevant triggering stage emitter 51 to 54 on that side thereof which is remote from the breakdown diode 10. The electrodes 91, 92, 93, 94 may be formed from metal, for example aluminum, or from polysilicon.

Arranged between the cathode electrode 9 and the p-doped base 6 are p-doped cathode short circuits 65, which are formed by pillar-like extensions of the p-doped base 6 that run in the vertical direction v. The cathode short circuits 65 ensure that the thyristor does not trigger in an uncontrolled manner before reaching the static breakover voltage even in the case of a high rate of rise of the thyristor voltage (dU/dt loading).

The p-doped emitter 8 of the thyristor has a weakly p-doped zone 81, in which are arranged heavily p-doped zones 82 that are more highly doped than regions of the p-type emitter 8 that surround the heavily doped zones 82. The heavily p-doped zones 82 are formed in pillar-type fashion, for example with a circular or rectangular cross section, in a vertical direction. The heavily p-doped zones 82 may additionally be formed as concentric circles.

Particularly in the surge current case of the thyristor, the heavily p-doped zones 82 inject very many free charge carriers into the weakly n-doped base zone 7, as a result of which the conductivity of the thyristor increases.

In normal on-state operation, the injection of the heavily p-doped zones is considerably smaller. Therefore, the heavily p-doped zones 82 do not contribute significantly to the injection of free charge carriers during the turn-off operation of the thyristor, so that, in the case of a predefined forward voltage in the surge current case, the stored charge that occurs during the turn-off operation of the thyristor is significantly reduced. This ensures that the thyristor is turned off rapidly since only few charge carriers have to be depleted. The current densities that occur in the surge current case are typically about one order of magnitude higher than in normal on-state operation and are e.g. a few hundred A/cm$^2$.

The heavily p-doped zones 82 may be spaced apart from the n-doped base 7 and extend as far as that surface of the semiconductor body 1 which is adjoined by the p-type emitter, that is to say as far as the rear side 12 of the semiconductor body 1.

The semiconductor body 1 and the electrodes 9, 19, 91 to 94 may be formed such that they are essentially rotationally symmetrical about an axis A-A' running in the vertical direction v. Deviations from rotational symmetry are caused for example by cathode short circuits 65 and the heavily p-doped zones 82.

Figure 2:
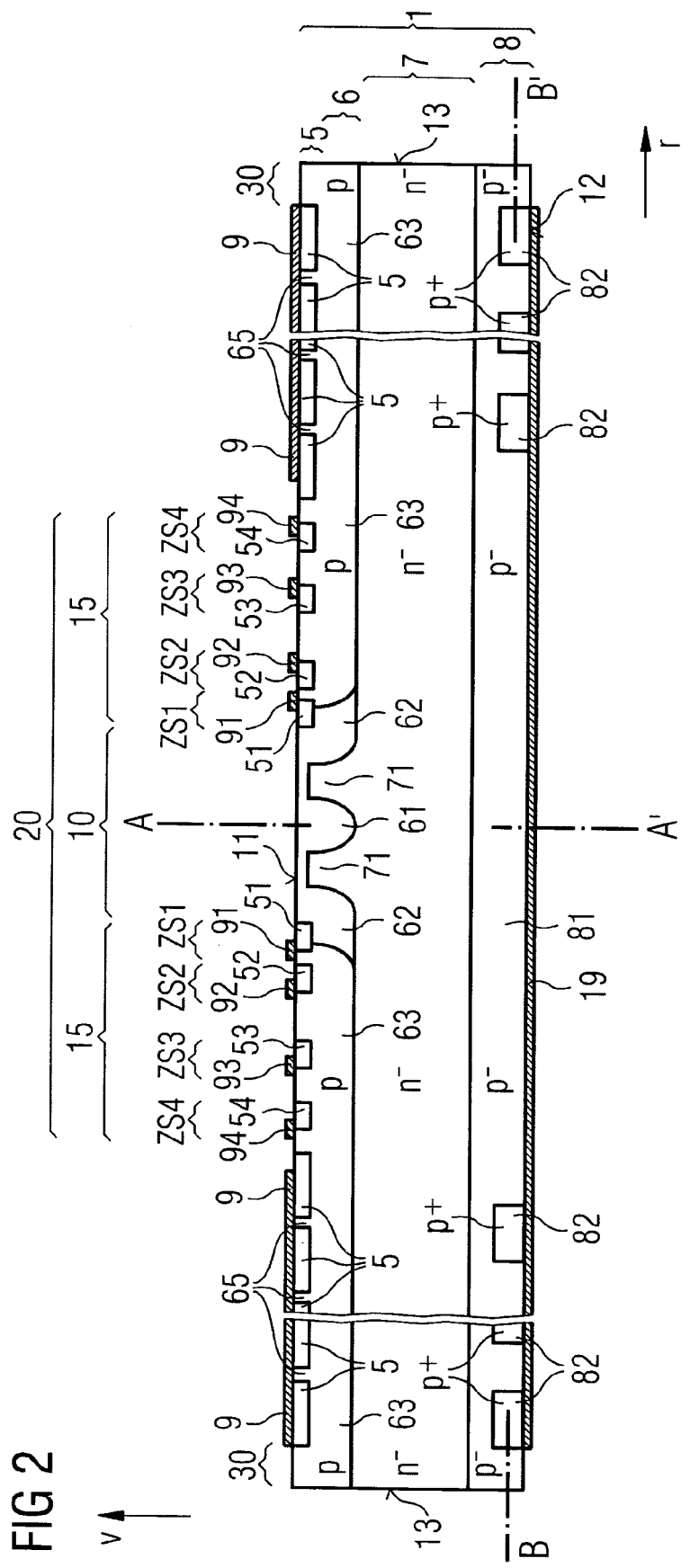
FIG. 2 shows a cross section through the thyristor in accordance with FIG. 1, the lateral edge of the semiconductor body additionally being illustrated in the figure.

Referring to FIG. 2, which illustrates the thyristor as far as a lateral edge 13 of the semiconductor body 1, the heavily p-doped zones 82, in the same way as the cathode short circuits 65, may extend in the lateral direction r to close to the lateral edge 13 of the semiconductor body 1.

The concept of a p-doped emitter 8 having an emitter efficiency that is varied due to the presence of the heavily p-doped zones 82 in the lateral direction r may also be used, in particular, for optimizing the edge termination of the thyristor. For this purpose, in an edge region 30 of the semiconductor body 1—contrary to the illustration in FIG. 2—heavily p-doped zones 82 are dispensed with, that is to say that the heavily p-doped zones 82 may be spaced apart from the lateral edge 13 of the semiconductor body 1. As a result, the space charge zone that forms at the pn junction between the p-doped emitter 8 and the n-doped base 7 in the case of reverse voltage present at the thyristor can extend very far into the p-doped emitter 8 in the edge region 30, thereby avoiding local excessive field increases.

Edge terminations present in the components are not illustrated in the figures, for reasons of clarity. Such edge terminations are known, in principle, and comprise for example bevels of the semiconductor body 1 in the region of the lateral edge 13, field rings or so-called VLD zones (VLD=variation of lateral doping).

In order to ensure an optimum triggering propagation when the thyristor is turned on, heavily p-doped zones 82 may likewise be dispensed with in the region of the breakdown structure 10 and/or the triggering stage region 15.

At the same time, in order to maximize the forward blocking capability of the thyristor, the transistor gain factor of the anodal parasitic pnp transistor formed by the p-type emitter 8, the n-type base 7 and the p-type base 6 may be set to be as small as possible.

FIG. 3 shows the lower, anodal section of a thyristor with the anode electrode 19, the p-doped emitter 8 and also in part the n-doped base 7, in which the heavily p-doped zones 82 are arranged in insular fashion in the p-doped emitter 8 and are completely surrounded by the zone 81 having a weaker p-type doping.

The heavily p-doped zones 82 may be produced by means of a masked indiffusion and/or masked implantation in combination with a drive-in step of acceptor atoms via the rear side 19.

By way of example, boron is suitable as dopant material in the case of a semiconductor body 1 made of silicon.

The heavily p-doped zones 82 make it possible, as described above, in the case of a forward voltage of the thyristor that is predefined for the surge current case, to inject many free charge carriers into the more weakly n-doped zone 7 in a targeted manner in the surge current case. Since the parameters of forward voltage and stored charge influence one another, these can be set by way of the charge carrier lifetime.

Referring to FIGS. 4 and 5, there is optionally the possibility of arranging a zone 40 having a reduced charge carrier lifetime in the p-doped emitter 8. Said zone 40 having a reduced charge carrier lifetime may comprise heavily p-doped zones 82 at least in sections and the zone 81 having a weaker p-type doping at least in sections.

Moreover, the zone 40 may be spaced apart from the rear side 12 of the semiconductor body 1.

Furthermore, the zone 40 may be spaced apart further from the front side 11 of the semiconductor body 1 than those sides of the heavily p-doped zones 82 which face the front side of the thyristor.

FIG. 4 shows a lower, anodal section of a thyristor in accordance with FIGS. 1 and 2, and FIG. 5 shows a lower, anodal section of a thyristor in accordance with FIG. 3, which in each case additionally have a zone 40 which is illustrated with a dashed border and in which the charge carrier lifetime is reduced compared with the charge carrier lifetime of the sections adjoining the zone 40.

In the case of the thyristors shown in FIGS. 3, 4 and 5, the n-doped base 7, the p-doped base 6, the n-doped main emitter 5, the triggering stage emitters 51, 52, 53, 54, the cathode short circuits 65, the cathode electrode 9 and the triggering stage electrodes 91, 92, 93, 94 may be correspondingly formed as in the case of the thyristor in accordance with FIGS. 1 and 2.

The zones 40 having a reduced charge carrier lifetime may be produced for example by means of a rear-side helium or proton irradiation of the semiconductor body 1, which may extend over the entire rear side of said semiconductor body.

Figure 6:
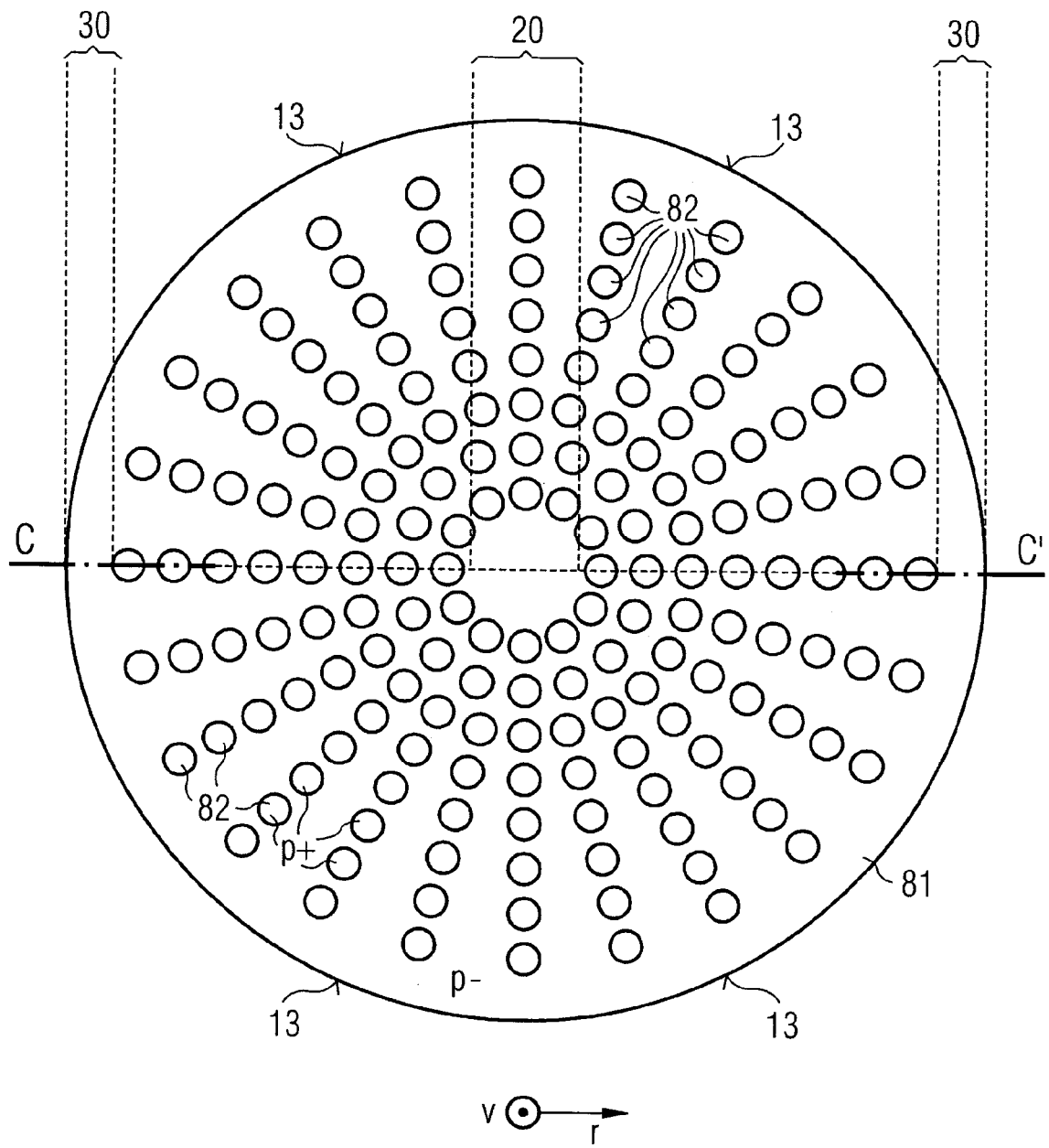
FIG. 6 shows a cross section through the p-type emitter of a bipolar power semiconductor component having cross-sectionally circular zones in which the doping is locally increased.

One possible arrangement of the heavily p-doped semiconductor zones 82 in the p-type base 8 is explained below with reference to FIG. 6. FIG. 6 shows a cross section through the thyristors in accordance with FIGS. 1 to 5 in the planes B-B' illustrated therein. In the example, the thyristors occupy the entire area of a wafer on the basis of which they are produced, and correspondingly have a circular cross section. Instead of a circular cross section, the thyristor may also have a different, for example a rectangular, in particular a square cross section in a lateral direction.

In the exemplary embodiment illustrated, the heavily p-doped zones 82 have circular cross sections, so that said zones 82 are cylindrical zones 82. In principle, however, the cross sections of the heavily p-doped zones 82 are arbitrary, so that said zones may have an arbitrary pillar-type geometry. Their form is determined by the masks used to produce them and also by the temperature and the duration of a heat treatment step performed after the introduction of the acceptor atoms.

Apart from a pillar-type or cylindrical structure, the p-doped zones 82 may also have the form of concentric rings in cross section in a manner not specifically illustrated.

In the case of the component illustrated in FIG. 6, there are no heavily p-doped zones 82 in the triggering region 20 and in the edge region 30.

In FIG. 6, C-C' designates the sectional plane in which the components are illustrated in FIGS. 1 to 5.

The distribution of the heavily p-doped zones 82 may be chosen as desired, in principle. The cross-sectional area proportion made up by the heavily p-doped zones 82 in a contiguous section of the cross-sectional area of the thyristor that has a plurality of heavily p-doped zones 82 may, as the distance between the contiguous section and the triggering region 20 increases, in particular be constant, fall monotonically or strictly monotonically, or rise monotonically or strictly monotonically.

FIG. 7 shows in side view in cross section a bipolar power semiconductor component formed as a power IGBT. The IGBT has a semiconductor body 1 having a front side 11 and a rear side 12. In said semiconductor body, a p-doped emitter 8, an n-doped base 7, a p-doped base 6 and an n-doped emitter 5 are arranged in a vertical direction proceeding from the rear side 12. An anode electrode 19 makes contact with the p-type emitter 8 and a cathode electrode 9 makes contact with the n-doped emitter 5. The cathode electrode additionally short-circuits the p-type base 6 and the n-type emitter 5 in a known manner. In the case of the component illustrated, the p-type base has for this purpose sections 66 extending in a vertical direction as far as the cathode electrode 9.

In the case of an IGBT, the n-type base 7, the p-type base 6 and the n-type emitter 5 are also referred to as drift zone 7, body zone 6 and source zone 5. The term source electrode is also customary correspondingly for the cathode electrode 9.

A gate electrode 31 is present for controlling an accumulation channel in the body zone 6 between the source zone 5 and the drift zone 7, said gate electrode being insulated from the semiconductor zones of the semiconductor body 1 by means of a gate insulation layer 32.

The IGBT illustrated is a trench IGBT, in which the gate electrode 31 is arranged in a trench extending in a vertical direction proceeding from the front side 11 into the semiconductor body 1. The gate electrode 31 may have an arbitrary geometry known for trench transistors. The gate electrode 31 may have, in particular, a plurality of strip-type electrode sections which are arranged in a manner spaced apart from one another in a lateral direction and which in each case run perpendicular to the plane of the drawing illustrated. Furthermore, the gate electrode 31, in a plane running perpendicular to the plane of the drawing illustrated, may also be realized in grid-type fashion with polygonal, in particular rectangular, grid cutouts. In a manner that is not specifically illustrated, the gate electrode may also be realized as a planar electrode above the front side 11 of the semiconductor body 1.

The p-type emitter 8 of the IGBT has a plurality of heavily p-doped semiconductor zones 82 which are more highly doped in comparison with the remaining regions 81 of the p-type emitter 8. The explanations given above in connection with the thyristors in accordance with FIGS. 1 to 6 hold true for the geometry and the arrangement of said heavily p-doped T-zones 82 in the p-type emitter 8. Thus, in the case of the IGBT too, the heavily doped zones 82 may adjoin the rear side 12 or be completely surrounded by the more weakly doped regions 81 of the p-type emitter 8 (not illustrated). The heavily p-doped zones are arranged in particular in insular fashion in the p-type emitter 8, that is to say that there are a plurality of heavily doped zones 82 which are arranged in a manner spaced apart from one another in a lateral direction and which have a polygonal or cylindrical cross section, for example, in a lateral plane.

It holds true for exemplary embodiments that the dimensions of a heavily p-doped zone 82 in a lateral direction may suitably be between 0.1-fold and 1-fold of a distance between two adjacent heavily doped zones 82. In other words, the dinesions of a heavily p-doped zone 82 vary between 10% and 100% of the dimensions of a more weakly doped section 81 arranged between two heavily doped zones 82.

In a vertical direction of the semiconductor body 1, the dimensions of the heavily p-doped zones 82 lie between 10% and 100% of the dimension of the p-type emitter 8 in a vertical direction. Given a maximum dimension (100%) of the heavily p-doped zones 82, the latter extend in a vertical direction from the rear side 12 as far as the n-type base 7.

The doping concentration of the heavily p-doped zones 82 is chosen such that the p-type dopant dose in the p-type emitter 8 is greater at least by one order of magnitude, that is to say at least by a factor of 10, in a region in which a heavily p-doped zone 82 is present than in a region which is formed only by a weakly doped section 81. In this case, the dopant dose corresponds to the integral of the doping concentration in a vertical direction proceeding from the rear side 12 as far as the n-type base.

The edge doping concentration of the more weakly doped sections 81 of the p-type emitter 8 lies for example between $1 \cdot 10^{15}$ cm$^{-3}$ and $1 \cdot 10^{16}$ cm$^{-3}$, where the doping profile corresponds e.g. approximately to a Gaussian profile and the doping maximum lies in the vicinity of the rear side 12. The doping concentration of the n-type base 7 is for example $1 \cdot 10^{13}$ cm$^{-3}$, the edge doping concentration of the p-type base 6 lies between $1 \cdot 10^{15}$ cm$^{-3}$ and $1 \cdot 10^{16}$ cm$^{-3}$ and the edge doping concentration of the n-type emitter lies for example between $1 \cdot 10^{19}$ cm$^{-3}$ and $1 \cdot 10^{20}$ cm$^{-3}$, where the doping profile in the p-type base and the n-type emitter may in turn approximately follow a Gaussian profile with the doping maximum on the front side 11. The Gaussian profiles of the doping concentration in the p-type emitter, the p-type base and the n-type base zone and the doping concentrations specified are presented here only as specific examples. In general, the doping profiles can be chosen as desired.

The invention claimed is:

1. A bipolar semiconductor component comprising a semiconductor body, the semiconductor body including a p-doped emitter, an n-doped base, a p-doped base and an n-doped main emitter arranged successively in a vertical direction, the p-doped emitter having a number of p-doped zones, the p-doped zones having a locally increased p-type doping, and configured as a thyristor, and further comprising a triggering stage structure having at least on triggering stage, and wherein the p-doped zones are disposed exclusively outside a lateral extent of the triggering stage structure.

2. The semiconductor component as claimed in claim 1, wherein the p-doped zones are spaced apart from the n-doped base.

3. The semiconductor component as claimed in claim 1, wherein the p-doped zones abut the n-type base.

4. The semiconductor component as claimed in claim 1, wherein the p-doped zones extend to a surface of the semiconductor component.

5. The semiconductor component as claimed in claim 1, wherein the p-doped zones are completely surrounded by the p-doped emitter.

6. The semiconductor component as claimed in claim 1, wherein all of the p-doped zones are spaced apart from the lateral edge of the semiconductor body.

7. The semiconductor component as claimed in claim 1, configured as an IGBT, and further comprising a gate electrode arranged adjacent to the p-type base.

8. The semiconductor component as claimed in claim 1, wherein the p-doped emitter includes a first zone having a locally reduced charge carrier lifetime.

9. The semiconductor component as claimed in claim 8, wherein the first zone is spaced apart from a surface of the semiconductor body nearest the p-type emitter.

10. The semiconductor component as claimed in claim 8, wherein:
    the n-doped main emitter is disposed adjacent to a first surface of the semiconductor body;
    a top surface of at least one of the p-doped zones closest to the first surface is spaced apart from the first surface by a first distance; and
    the first zone is separate from the first surface by a distance greater than the first distance.

11. The semiconductor component as claimed in claim 8, wherein the first zone includes at least portions of at least one p-doped zone, and at least portions of an area of the p-doped emitter outside of the p-doped zones.

12. The semiconductor component as claimed in claim 8, wherein a lateral dimension of at least one p-doped zone is between 10% and 100% of a lateral distance between adjacent p-doped zones.

13. The semiconductor component as claimed in claim 8, wherein a vertical dimension of at least on p-doped zone is between 10% and 100% of a vertical dimension of the p-doped emitter.

14. The semiconductor component as claimed in claim 8, wherein a dopant dose determined in a vertical direction in the p-type emitter is greater at least by a factor of 10 in a region in which a p-type zone is located than in a region without a p-type zone.

15. A bipolar semiconductor component comprising
    a semiconductor body portion, the semiconductor body portion including a p-doped emitter, an n-doped base, a p-doped base and an n-doped emitter arranged successively in a vertical direction, the p-doped emitter having a number of p-doped zones, the p-doped zones having an increased p-type doping compared to adjacent portions of the p-doped emitter;
    a first electrode proximate to the p-doped emitter;
    a second electrode proximate to the n-doped emitter, and configured as a thyristor, and further comprising a triggering stage structure having at least on triggering stage, and wherein the p-doped zones are disposed exclusively outside a lateral extent of the triggering stage structure.

* * * * *